United States Patent
Baek et al.

(10) Patent No.: US 9,524,937 B2
(45) Date of Patent: Dec. 20, 2016

(54) SEMICONDUCTOR DEVICES AND METHODS OF FABRICATING THE SAME

(71) Applicant: Samsung Electronics Co., Ltd., Suwon-si (KR)

(72) Inventors: Jongmin Baek, Suwon-si (KR); Sangho Rha, Seongnam-si (KR); Sanghoon Ahn, Goyang-si (KR); Wookyung You, Suwon-si (KR); Naein Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 45 days.

(21) Appl. No.: 14/503,877

(22) Filed: Oct. 1, 2014

(65) Prior Publication Data

US 2015/0187699 A1    Jul. 2, 2015

(30) Foreign Application Priority Data

Dec. 30, 2013 (KR) .................. 10-2013-0167196

(51) Int. Cl.
*H01L 21/768* (2006.01)
*H01L 23/532* (2006.01)
*H01L 23/522* (2006.01)

(52) U.S. Cl.
CPC ..... *H01L 23/53266* (2013.01); *H01L 21/7682* (2013.01); *H01L 21/76834* (2013.01); *H01L 23/5222* (2013.01); *H01L 23/53223* (2013.01); *H01L 23/53238* (2013.01); *H01L 23/53295* (2013.01); *H01L 2924/0002* (2013.01)

(58) Field of Classification Search
CPC ............ H01L 21/7682; H01L 23/5222; H01L 23/53295; H01L 21/76807; H01L 21/76835; H01L 21/76831; H01L 21/76829; H01L 21/764; H01L 21/76264; H01L 29/4991; H01L 2221/1042; H01L 2221/1047; H01L 21/7627
See application file for complete search history.

(56) References Cited

U.S. PATENT DOCUMENTS

| | | |
|---|---|---|
| 6,165,890 A | 12/2000 | Kohl et al. |
| 6,265,321 B1 | 7/2001 | Chooi et al. |
| 6,399,476 B2 | 6/2002 | Kim et al. |
| 6,423,629 B1 | 7/2002 | Ahn et al. |
| 6,524,948 B2 | 2/2003 | Tamaoka et al. |
| 6,908,829 B2 | 6/2005 | Hussein et al. |
| 7,042,095 B2 | 5/2006 | Noguchi et al. |
| 7,449,407 B2 | 11/2008 | Lur et al. |
| 7,473,632 B2 | 1/2009 | Ueda |
| 7,501,347 B2 | 3/2009 | Noguchi et al. |
| 8,034,693 B2 | 10/2011 | Shibata et al. |
| 8,288,268 B2 | 10/2012 | Edelstein et al. |
| 2003/0183940 A1* | 10/2003 | Noguchi ........... H01L 21/76801 257/767 |

(Continued)

FOREIGN PATENT DOCUMENTS

| | | |
|---|---|---|
| JP | 2011146590 A | 7/2011 |
| KR | 20030056796 A | 7/2003 |
| KR | 20040022344 A | 3/2004 |

*Primary Examiner* — Thomas L Dickey
*Assistant Examiner* — Leslie Pilar Cruz
(74) *Attorney, Agent, or Firm* — Myers Bigel, P.A.

(57) ABSTRACT

Semiconductor devices are provided. A semiconductor device includes gaps between conductive patterns. Moreover, the semiconductor device includes a permeable layer on the conductive patterns. Methods of fabricating semiconductor devices are also provided.

20 Claims, 12 Drawing Sheets

(56) References Cited

U.S. PATENT DOCUMENTS

2009/0115061 A1* 5/2009 Chen ................ H01L 21/76807
257/751
2011/0260326 A1 10/2011 Clevenger et al.

* cited by examiner

SEMICONDUCTOR DEVICES AND METHODS OF FABRICATING THE SAME

CROSS-REFERENCE TO RELATED APPLICATION

This U.S. non-provisional patent application claims priority under 35 U.S.C. §119 to Korean Patent Application No. 10-2013-0167196, filed on Dec. 30, 2013 in the Korean Intellectual Property Office (KIPO), the contents of which are hereby incorporated by reference herein in their entireties.

BACKGROUND

The present disclosure relates to semiconductor devices. Semiconductor devices may trend toward higher integration, higher density, lower power consumption, and faster operating speeds. A semiconductor device with highly integrated circuits may include a multi-layered interconnection structure, which may be formed of a metal material (e.g., aluminum). For example, the formation of aluminum interconnection lines may include depositing an aluminum layer on an insulating layer and etching it to expose the insulating layer.

The use of copper, instead of aluminum, as a material for interconnection lines, may increase as a design rule of semiconductor devices decreases. This may be due to the relatively high electrical resistivity of aluminum. For example, as a width of an aluminum line decreases, its resistance increases, and thus it may be a difficult to realize semiconductor devices with higher operating speeds. Copper may offer advantages in cost and electrical conductivity, but there may be difficulty in patterning a copper layer using an etching technique. A damascene process may also be used to form copper interconnection lines.

Further, due to the increasing integration density of semiconductor devices, a space between interconnection lines may become narrower and narrower, and this may cause electrical interference between interconnection lines and a delay in a signal transfer speed, despite the use of copper interconnection lines.

SUMMARY

An aspect of the present inventive concepts provides a semiconductor device having an air gap. Another aspect of the present inventive concepts provides a method of fabricating a semiconductor device having an air gap.

In one example embodiment, a semiconductor device may include a substrate including a first region and second regions, a plurality of first conductive patterns on the first region and a plurality of second conductive patterns on the second region, respectively, an insulating diffusion barrier layer covering sidewalls and upper surfaces of the first and second conductive patterns, a permeable layer on the insulating diffusion barrier layer, a first air gap between the plurality of first conductive patterns, a second air gap between the plurality of second conductive patterns, and wherein the first air gap is defined by sidewalls and an upper surface of the insulating diffusion barrier layer, and wherein the second air gap is defined by sidewalls and an upper surface of the insulating diffusion barrier layer and a bottom surface of the permeable layer.

In some embodiments, the permeable layer may be spaced apart from the first air gap.

In some embodiments, the insulating diffusion barrier layer may be thinner on a bottom of the first air gap than on a bottom of the second air gap.

In some embodiments, the insulating diffusion barrier layer may be thinner on the sidewall of the first conductive patterns than on the sidewall of the second conductive patterns.

In some embodiments, the permeable layer may be disposed on both of the first and second regions.

In some embodiments, the semiconductor device may further include a third conductive pattern on a boundary of the first and second regions, wherein the insulating diffusion barrier layer covers both sidewalls of the third conductive pattern. The insulating diffusion barrier layer may be thinner on a sidewall of the third conductive pattern adjacent to the first region than on other sidewall of the third conductive pattern adjacent to the second region.

In some embodiments, the semiconductor device may further include a protection layer between the insulating diffusion barrier layer and the upper surfaces of the first and second conductive patterns.

In some embodiments, the semiconductor device may further include a metal diffusion barrier layer covering the sidewalls and the bottom of the first and second conductive patterns.

In accordance with another aspect of the present inventive concepts, a semiconductor device may include a plurality of first conductive patterns on a substrate, a first insulating diffusion barrier layer covering sidewalls and upper surfaces of the first conductive patterns, a first permeable layer on the first insulating diffusion barrier layer, a plurality of second conductive patterns on the first permeable layer, a second insulating diffusion barrier layer covering sidewalls and upper surfaces of the second conductive patterns, a second permeable layer on the second insulating diffusion barrier layer, a first air gap between the plurality of first conductive patterns, a second air gap between the plurality of second conductive patterns. The first air gap is defined by sidewalls and an upper surface of the first insulating diffusion barrier layer. The second air gap is defined by sidewalls and an upper surface of the second insulating diffusion barrier layer and a bottom surface of the second permeable layer.

In some embodiments, the first permeable layer may be spaced apart from the first air gap.

In some embodiments, the first insulating diffusion barrier layer disposed on a bottom of the first air gap may be thinner than the second insulating diffusion barrier layer disposed on a bottom of the second air gap.

In some embodiments, the semiconductor device may further include a first protection layer between the first insulating diffusion barrier layer and the upper surfaces of the first conductive patterns.

In some embodiments, the semiconductor device may further include a second protection layer between the second insulating diffusion barrier layer and the upper surfaces of the second conductive patterns.

In some embodiments, the semiconductor device may further include a first metal diffusion barrier layer covering the sidewalls and the bottom of the first conductive patterns.

In some embodiments, the semiconductor device may further include a second metal diffusion barrier layer covering the sidewalls and the bottom of the second conductive patterns.

In accordance with still another aspect of the present inventive concepts, a semiconductor device may include a plurality of first conductive patterns on a substrate, a first insulating diffusion barrier layer covering sidewalls and upper surfaces of the first conductive patterns, a first permeable layer on the first insulating diffusion barrier layer, a plurality of second conductive patterns on the first permeable layer, a second insulating diffusion barrier layer covering sidewalls and upper surfaces of the second conductive patterns, a second permeable layer on the second insulating diffusion barrier layer, a first air gap between the plurality of first conductive patterns, a second air gap between the plurality of second conductive patterns. The first air gap is defined by sidewalls and an upper surface of the first insulating diffusion barrier layer and a bottom surface of the first permeable layer. The second air gap is defined by sidewalls and an upper surface of the second insulating diffusion barrier layer.

In some embodiments, the second permeable layer may be spaced apart from the second air gap.

In some embodiments, the first insulating diffusion barrier layer disposed on a bottom of the first air gap may be thicker than the second insulating diffusion barrier layer disposed on a bottom of the second air gap.

In some embodiments, the semiconductor device may further include a first protection layer between the first insulating diffusion barrier layer and the upper surfaces of the first conductive patterns.

In some embodiments, the semiconductor device may further include a second protection layer between the second insulating diffusion barrier layer and the upper surfaces of the second conductive patterns.

In accordance with still another aspect of the present inventive concepts, a method of manufacturing a semiconductor device may include forming first and second conductive patterns on first and second regions, respectively, of a substrate. The first conductive patterns may be formed to be spaced apart from each other with a first space, and the second conductive patterns may be formed to be spaced apart from each other with a second space that is larger than the first space. The method may further include forming an insulating diffusion barrier layer to cover side and top surfaces of the first and second conductive patterns and define a first air gap between the first conductive patterns, forming a sacrificial layer pattern to fill a space between the second conductive patterns, forming a permeable layer on the insulating diffusion barrier layer and the sacrificial layer pattern, and removing the sacrificial layer pattern to form a second air gap.

In some embodiments, the forming of the first and second conductive patterns may include forming an interlayer insulating layer on the substrate to include first recess regions spaced apart from each other with the first space on the first region and second recess regions spaced apart from each other with the second space on the second region, forming the first and second conductive patterns in the first and second recess regions, respectively, and etching the interlayer insulating layer to expose the side surfaces of the first and second conductive patterns.

In some embodiments, the method may further include forming a protection layer to cover top surfaces of the first and second conductive patterns, before the etching of the interlayer insulating layer.

In some embodiments, the protection layer may be formed of at least one of metals including tantalum, ruthenium, cobalt, manganese, titanium, tungsten, nickel, and aluminum, oxides of the metals, nitrides of the metals, or oxynitrides of the metals.

In some embodiments, the sacrificial layer pattern may be formed of a hydrocarbon layer, and the removing of the sacrificial layer pattern may include an ashing process, which may be performed to transform the sacrificial layer pattern into a gas phase and exhaust the gas through the permeable layer.

In some embodiments, the insulating diffusion barrier layer may be formed of at least one of silicon carbon nitride (SiCN), silicon nitride (SiN), or silicon oxycarbide (SiOC).

In some embodiments, the insulating diffusion barrier layer may be formed to may have a thickness of 70 Å or thicker, on the side surface of the second conductive pattern.

In some embodiments, the method may further include forming a third recess region in the permeable layer, before the removing of the sacrificial layer pattern, and then, forming a third conductive pattern in the third recess region.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
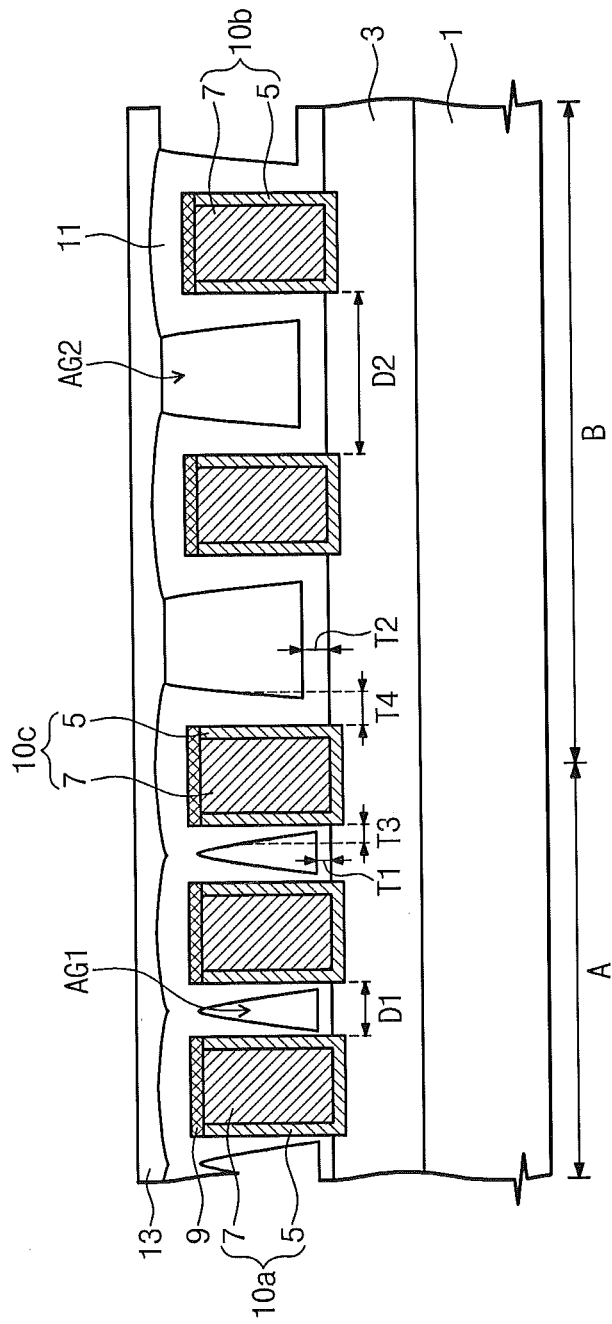
FIG. 1 is a sectional view illustrating a semiconductor device according to example embodiments of present inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of present inventive concepts will now be described more fully with reference to the accompanying drawings, in which example embodiments are shown. Example embodiments of present inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, steps, operations, elements and/or components, but do not preclude the presence or addition of one or more other features, steps, operations, elements, components and/or groups thereof.

Unless otherwise defined, all terms (including technical and scientific terms) used herein have the same meaning as commonly understood by one of ordinary skill in the art to which example embodiments of present inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a sectional view illustrating a semiconductor device according to example embodiments of present inventive concepts.

Referring to FIG. 1, an interlayer insulating layer 3 may be provided on a substrate 1 including a first region A and a second region B. In some embodiments, a device isolation layer and transistors may be provided on the substrate 1. Further, conductive patterns 10a, 10b, and 10c may be provided on the interlayer insulating layer 3. In some embodiments, the conductive patterns 10a, 10b, and 10c may be provided in the form of a plurality of lines extending along a specific direction, and in some example embodiments, each of them may be provided in the form of a contact plug or of an interconnection structure including a contact plug and a conductive line. In some embodiments, at least one of the conductive patterns 10a, 10b, and 10c may be electrically connected to contact plugs or interconnection lines, which may be provided in the interlayer insulating layer 3. The conductive patterns 10a, 10b, and 10c may include first conductive patterns 10a disposed on the first region A, second conductive patterns 10b disposed on the second region B, and a third conductive pattern 10c disposed on a boundary between the first and second regions A and B. A first space D1 between the first conductive patterns 10a may be smaller than a second space D2 between the second conductive patterns 10b. In certain embodiments, the third conductive pattern 10c may be one of the first conductive patterns 10a located most adjacent (e.g., closest) to the second region B or one of the second conductive patterns 10b located most adjacent (e.g., closest) to the first region A. A space between the third conductive pattern 10c and the first conductive pattern 10a adjacent thereto may be equal to the space between the first conductive patterns 10a. A space between the third conductive pattern 10c and the second conductive pattern 10b adjacent thereto may be equal to the space between the second conductive patterns 10b.

Each of the conductive patterns 10a, 10b, and 10c may include an interconnection line portion 7 and a metal diffusion barrier layer 5 covering side and bottom surfaces thereof. Top surfaces of the conductive patterns 10a, 10b, and 10c may be covered with a protection layer 9. The interconnection line portion 7 may be formed of a low-resistance conductive material (e.g., copper, tungsten, or aluminum). The diffusion barrier layer 5 may be formed of at least one selected from the group consisting of titanium (Ti), titanium nitride (TiN), tantalum (Ta), tantalum nitride (TaN), ruthenium (Ru), cobalt (Co), manganese (Mn), tungsten nitride (WN), nickel (Ni), and nickel boron (NiB). The protection layer 9 may be formed of at least one of metals (for example, including tantalum, ruthenium, cobalt, manganese, titanium, tungsten, nickel, and/or aluminum), oxides of the metals, nitrides of the metals, or oxynitrides of the metals.

An insulating diffusion barrier layer 11 may be provided to cover not only top and side surfaces of the conductive patterns 10a, 10b, and 10c but also a top surface of the interlayer insulating layer 3. The insulating diffusion barrier layer 11 may be provided to have first and second thicknesses T1 and T2 on the first and second regions A and B, respectively, when measured on the interlayer insulating layer 3, and in some embodiments, the first thickness T1 may be smaller than the second thickness T2. Further, the insulating diffusion barrier layer 11 may be provided to have third and fourth thicknesses T3 and T4 on sidewalls of the first and second conductive patterns 10a and 10b, respectively, when measured at the same level, and, in some embodiments, the third thickness T3 may be smaller than the fourth thickness T4. The insulating diffusion barrier layer 11 may have the third thickness T3 on a sidewall of the third conductive pattern 10c adjacent to the first region A and the fourth thickness T4, which is thicker than the third thickness T3, on an opposite sidewall of the third conductive pattern 10c adjacent to the second region B. In some embodiments, the fourth thickness T4 of the insulating diffusion barrier layer 11 may be equal to or greater than 70 Å.

The insulating diffusion barrier layer 11 may be formed to define first air gaps AG1 between the first conductive patterns 10a and between the third conductive pattern 10c and the first conductive pattern 10a adjacent thereto. The insulating diffusion barrier layer 11 may be formed of at least one of silicon carbon nitride (SiCN), silicon nitride (SiN), or silicon oxycarbide (SiOC).

A permeable layer 13 may be provided on the insulating diffusion barrier layer 11 to span the first region A and the second region B. In certain embodiments, the permeable layer 13 may be formed of at least one of carbon-doped hydrogenated silicon oxide (SiOCH), low-temperature tetraethoxysilane (TEOS), or the mixture therof. The permeable layer 13, in conjunction with the insulating diffusion barrier layer 11 on the second region B, may define second air gaps AG2 between the second conductive patterns 10b and between the third conductive pattern 10c and the second conductive pattern 10b adjacent thereto.

For the semiconductor device of FIG. 1, the air gap AG2 may be provided on the second region B, in which the second conductive patterns 10b are spaced apart from each other with a large space, and this may make it possible to reduce Resistor-Capacitor (RC) delay between conductive patterns and thereby increase a signal transfer speed of the device.

A process of fabricating the semiconductor device of FIG. 1 will be described with reference to FIGS. 2 through 8.

FIGS. 2 through 8 are sectional views illustrating the process of fabricating a semiconductor device, whose section is shaped like that of FIG. 1.

Figure 2:
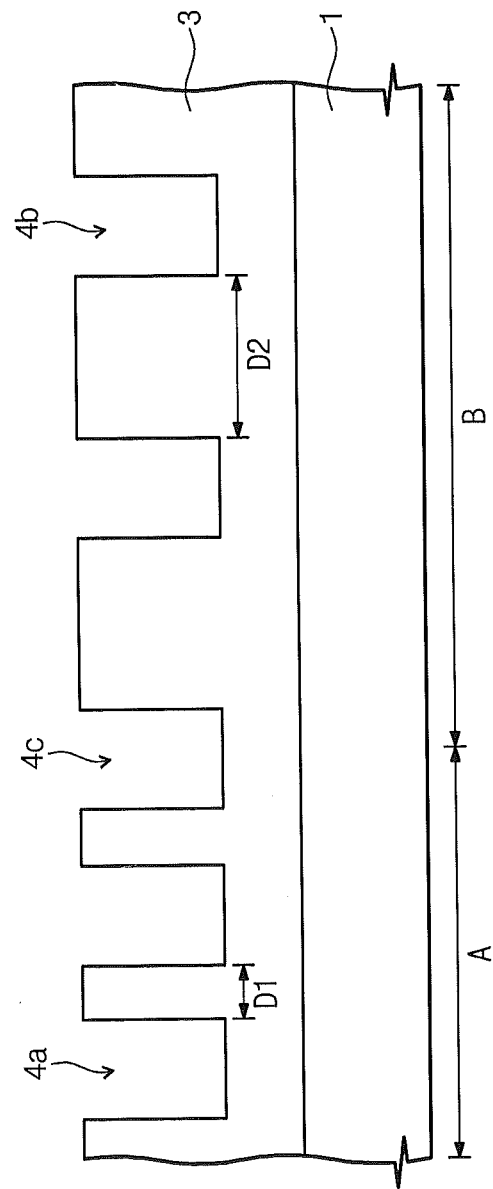
FIGS. 2 through 8 are sectional views illustrating a process of fabricating a semiconductor device, whose section is shaped like that of FIG. 1.

Referring to FIG. 2, an interlayer insulating layer 3 may be formed on a substrate including a first region A and a second region B. The interlayer insulating layer 3 may be patterned to form recess regions 4a, 4b, and 4c. The recess regions 4a, 4b, and 4c may include first recess regions 4a formed on the first region A, second recess regions 4b formed on the second region B, and a third recess region 4c formed on a boundary between the first and second regions A and B. Spaces between the first recess regions 4a and between the third recess region 4c and the first recess region 4a adjacent thereto may be a first space D1. Spaces between the second recess regions 4b and between the third recess region 4c and the second recess region 4b adjacent thereto may be a second space D2. The first space D1 may be smaller than the second space D2.

Figure 3:
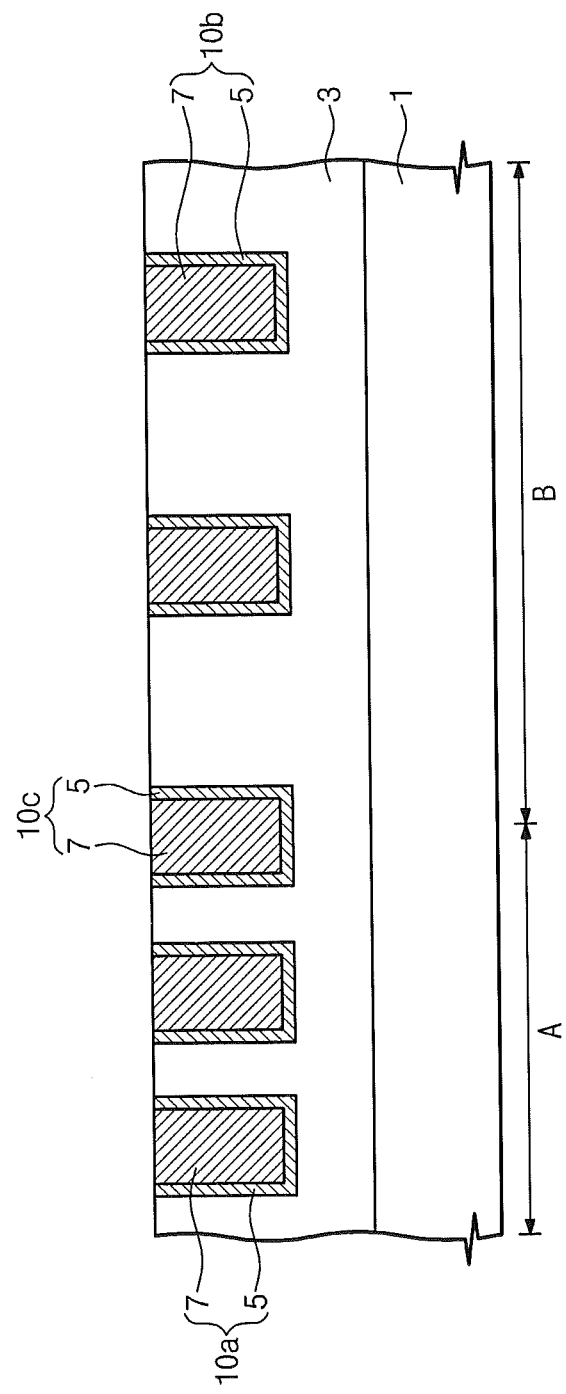

Referring to FIG. 3, a metal diffusion barrier layer 5 may be conformally formed on the interlayer insulating layer 3, and then, a conductive layer may be formed to fill the recess regions 4a, 4b, and 4c having the metal diffusion barrier layer 5. A planarizing or polishing process may be performed to the conductive layer and the metal diffusion barrier layer 5 to expose a top surface of the interlayer insulating layer 3 without removing the metal diffusion barrier layer 5 and an interconnection line portion 7 from each of the recess regions 4a, 4b, and 4c. Accordingly, conductive patterns 10a, 10b, and 10c may be formed in the recess regions 4a, 4b, and 4c, respectively. In some embodiments, spaces between the conductive patterns 10a, 10b, and 10c may be given/defined by spaces between the recess regions 4a, 4b, and 4c.

Figure 4:
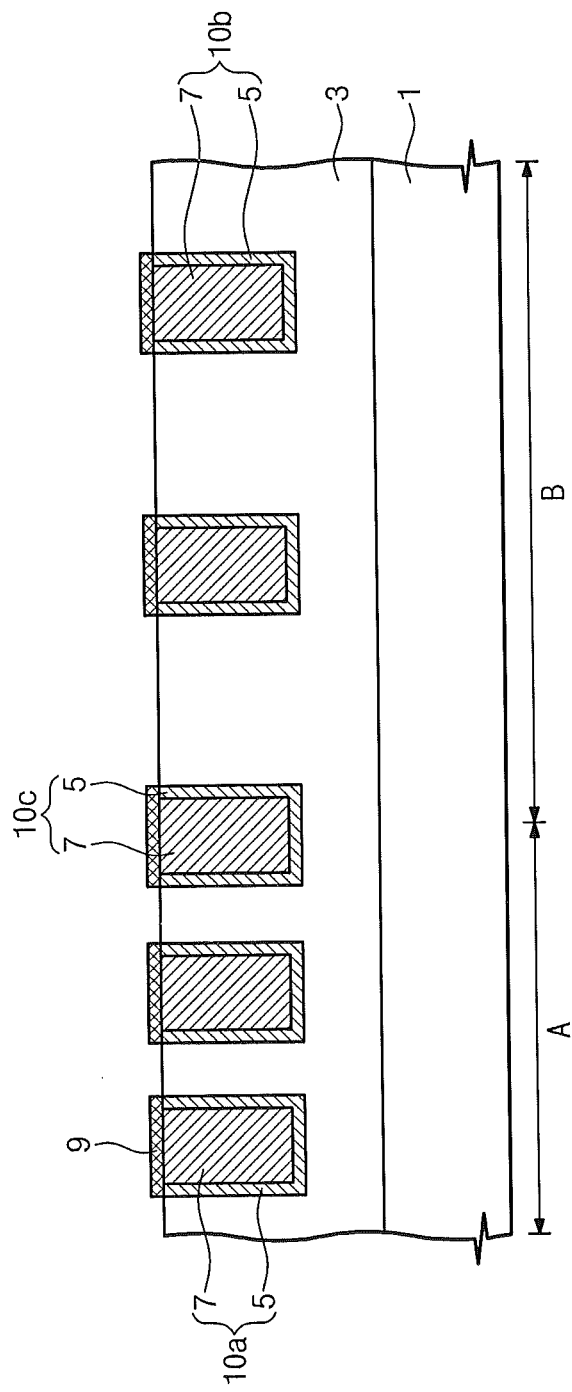

Referring to FIG. 4, a protection layer 9 may be formed on the conductive patterns 10a, 10b, and 10c. The protection layer 9 may be formed using, for example, a deposition process.

Figure 5:
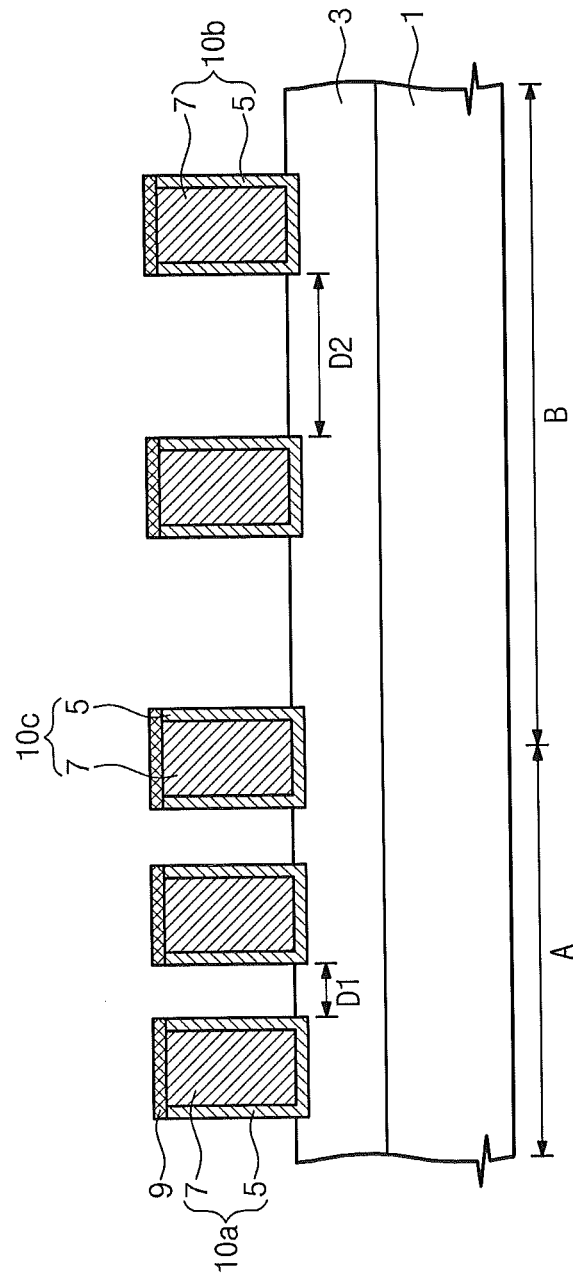

Referring to FIG. 5, the interlayer insulating layer 3 may be etched in an etch-back manner to expose side surfaces of the conductive patterns 10a, 10b, and 10c. Here, owing to the presence of the protection layer 9, it may be possible to protect the interconnection line portion 7 from being damaged in the etch-back process.

As described with reference to FIGS. 2 through 5, a damascene process may be used to form the conductive patterns 10a, 10b, and 10c. By using the damascene process, the interconnection line portion 7 can be formed of copper that is hardly etched (e.g., etching of the copper may be reduced).

In some embodiments, the process of forming the conductive patterns 10a, 10b, and 10c is not limited to the damascene process. For example, the conductive patterns 10a, 10b, and 10c may be formed by depositing a conductive layer on an interlayer insulating layer 3 and then patterning the conductive layer.

Figure 6:
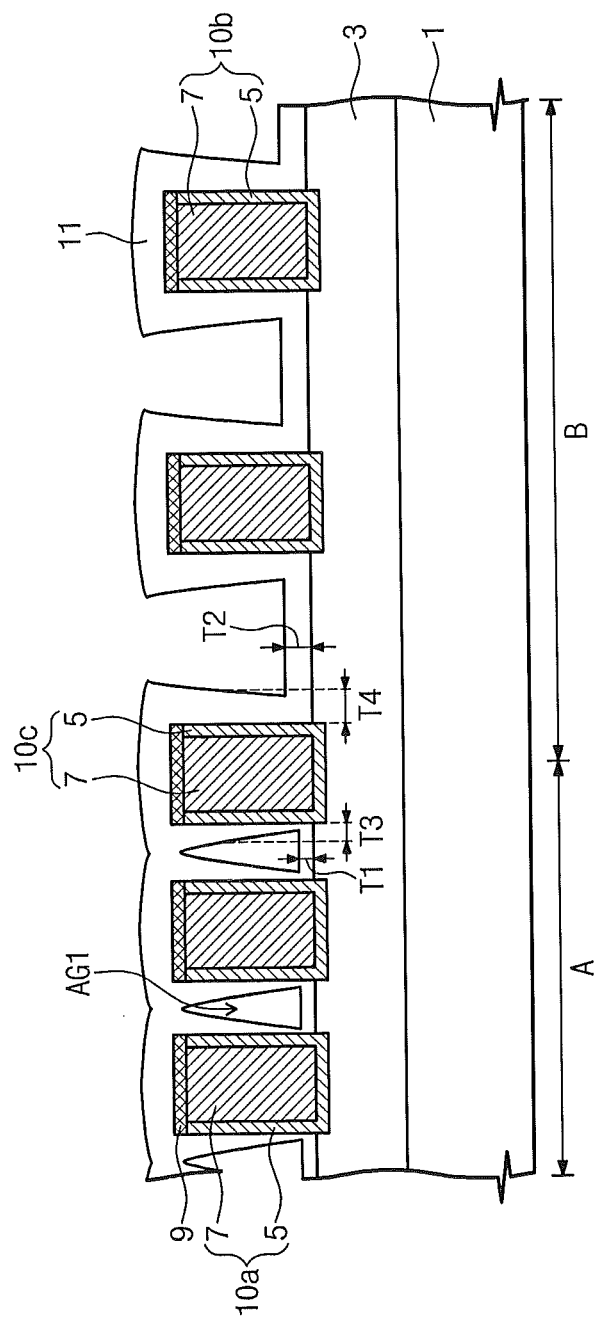

Referring to FIG. 6, an insulating diffusion barrier layer 11 may be provided on a front side of the substrate 1. In certain embodiments, the insulating diffusion barrier layer 11 may be formed using a deposition process exhibiting a poor step coverage property (e.g., a sputtering process or a physical vapor deposition process). For example, the insulating diffusion barrier layer 11 may be thicker on top surfaces of the conductive patterns 10a, 10b, and 10c than on side surfaces of the conductive patterns 10a, 10b, and 10c and a top surface of the interlayer insulating layer 3. Accordingly, the insulating diffusion barrier layer 11 may have overhang portions closing top entrances of narrow regions (e.g., of the first space D1) between the first conductive patterns 10a and between the third conductive pattern 10c and the first conductive pattern 10a adjacent thereto and thereby defining first air gaps AG1. By contrast, wide regions between the second conductive patterns 10b and between the third conductive pattern 10c and the second conductive pattern 10b adjacent thereto may not be closed by the insulating diffusion barrier layer 11. As described with reference to FIG. 1, the insulating diffusion barrier layer 11 may have a position-dependent thickness (e.g., the thicknesses T1, T2, T3, and T4).

Figure 7:
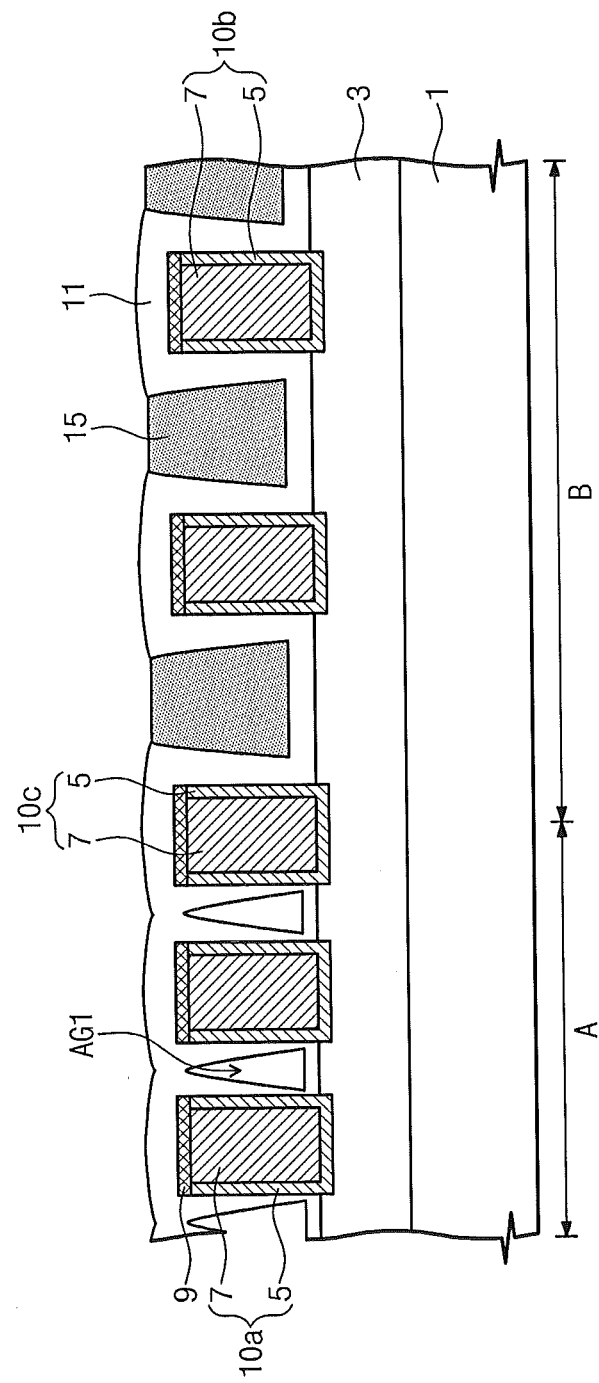

Referring to FIG. 7, a sacrificial layer may be formed and be etched to form sacrificial layer patterns 15 on the second region B. For example, the sacrificial layer patterns 15 may be formed to fill spaces between the second conductive patterns 10b and between the third conductive pattern 10c and the second conductive pattern 10b adjacent thereto. In some embodiments, due to the presence of the insulating diffusion barrier layer 11, the sacrificial layer pattern 15 may not be formed on the first region A. The sacrificial layer pattern 15 may be formed of a layer of hydrocarbon ($C_xH_y$), which may be formed by a spin-on-dielectrics (SOD) process or a Plasma-Enhanced Chemical Vapor Deposition (PE-CVD) process.

Figure 8:
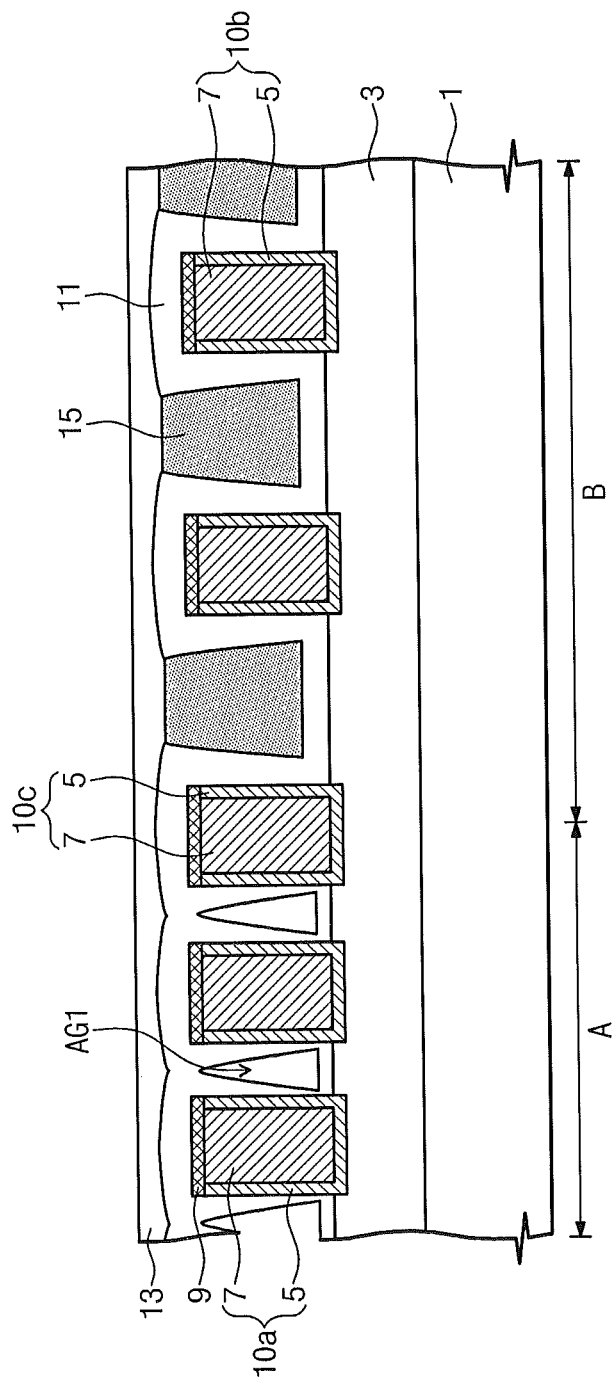

Referring to FIGS. 8 and 1, a permeable layer 13 may be formed on the insulating diffusion barrier layer 11 and the sacrificial layer pattern 15. An ashing process may be performed to selectively remove the sacrificial layer pattern 15. The ashing process may be performed by supplying gas (e.g., at least one of Ammonia ($NH_3$), Hydrogen ($H_2$), Nitrous Oxide ($N_2O$), Oxygen ($O_2$), Carbon Dioxide ($CO_2$), or Carbon Monoxide (CO)) capable of producing a hydrogen radical or oxygen radical at a temperature of 20-400° C. The hydrogen or oxygen radical produced in the ashing process may pass through the permeable layer 13 and react with hydrocarbon of the sacrificial layer pattern 15. As the result of the reaction, the sacrificial layer pattern 15 may be transformed from a solid phase to a gas phase (e.g., methane ($CH_3$), carbon dioxide ($CO_2$), or carbon monoxide (CO)), and the gas may be exhausted to the outside through the permeable layer 13. In other words, the sacrificial layer pattern 15 may be removed, and consequently second air gaps AG2 may replace the sacrificial layer patterns 15. Since the insulating diffusion barrier layer 11 with a thickness of 70 Å or thicker covers the sidewalls of the second and third conductive patterns 10b and 10c on the second region B, oxygen may not infiltrate into the second and third conductive patterns 10b and 10c, during the ashing process. Accordingly, it may be possible to protect the conductive patterns 10a, 10b, and 10c from being damaged or oxidized.

As a result, it may be possible to form air gaps between interconnection lines with various intervals or pitches.

Figure 9:
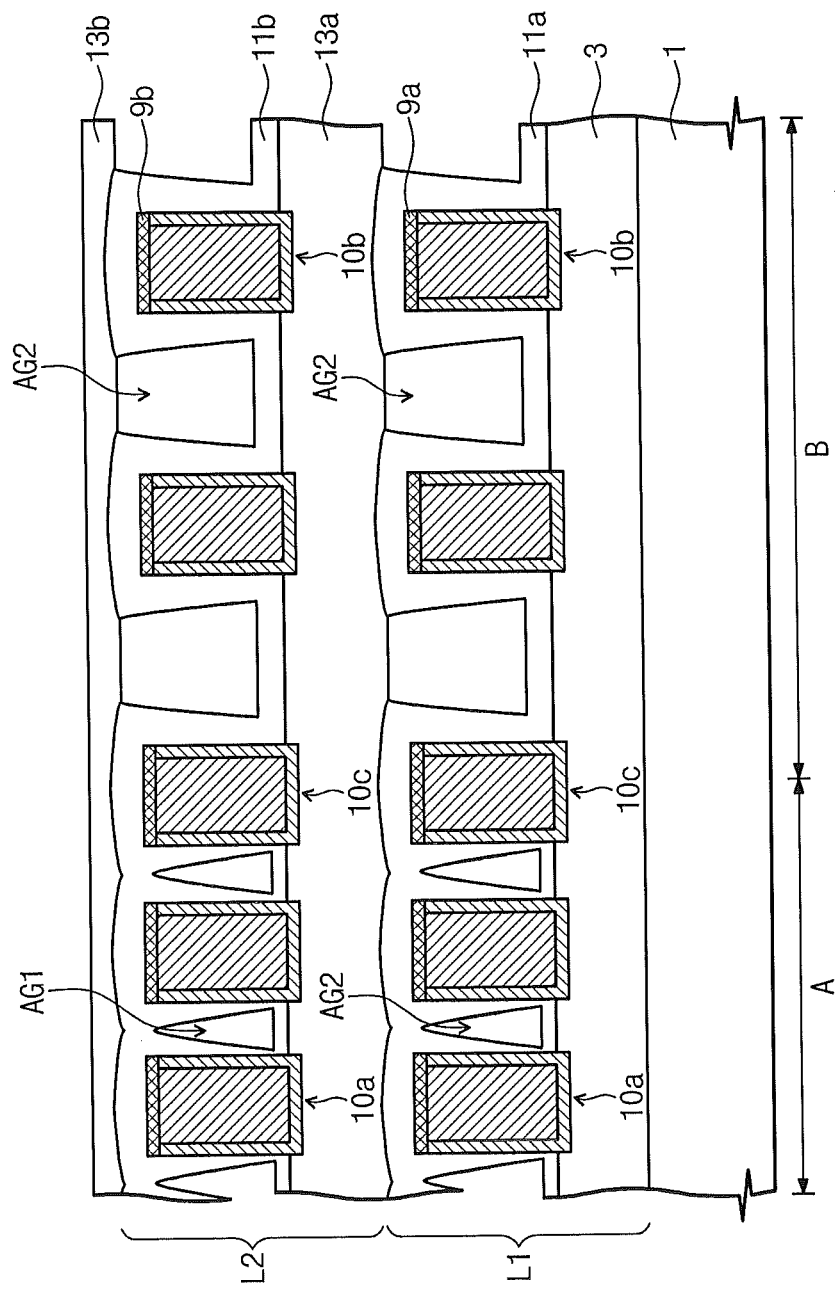
FIG. 9 is a sectional view illustrating a semiconductor device according to example embodiments of present inventive concepts.

FIG. 9 is a sectional view illustrating a semiconductor device according to some example embodiments of present inventive concepts.

Referring to FIG. 9, a first interconnection structure L1 and a second interconnection structure L2 may be sequentially stacked on a substrate 1 with a first region A and a second region B. Except for a difference associated with the permeable layer, the first interconnection structure L1 may be configured to have substantially the same or similar structure as the interconnection line of FIG. 1. For example, the first interconnection structure L1 may include an interlayer insulating layer 3, conductive patterns 10a, 10b, and 10c on the interlayer insulating layer 3, a first protection layer 9a on the conductive patterns 10a, 10b, and 10c, a first insulating diffusion barrier layer 11a covering the conductive patterns 10a, 10b, and 10c with the first protection layer 9a, and air gaps AG1 and AG2 between the conductive patterns 10a, 10b, and 10c. The second interconnection structure L2 may have a structure similar to the first interconnection structure L1, but the conductive patterns 10a, 10b, and 10c thereof may be provided on a first permeable layer 13a, in place of the interlayer insulating layer 3. In other words, the second interconnection structure L2 may include the first permeable layer 13a, the conductive patterns 10a, 10b, and 10c on the first permeable layer 13a, a second protection layer 9b on the conductive patterns 10a, 10b, and 10c, and a second insulating diffusion barrier layer 11b covering the conductive patterns 10a, 10b, and 10c with the second protection layer 9b, and air gaps AG1 and AG2 between the conductive patterns 10a, 10b, and 10c. The second interconnection structure L2 may be covered with a second permeable layer 13b. In certain embodiments, the protection layers 9a and 9b may be provided to have substantially the same features as the protection layer 9 of FIG. 1. The insulating diffusion barrier layers 11a and 11b may be provided to have substantially the same features as the insulating diffusion barrier layer 11 described with reference to FIG. 1. The permeable layers 13a and 13b may be provided to have substantially the same features as the permeable layer 13 described with reference to FIG. 1. Other elements may also be configured to have substantially the same features as corresponding ones of FIG. 1.

Figure 10:
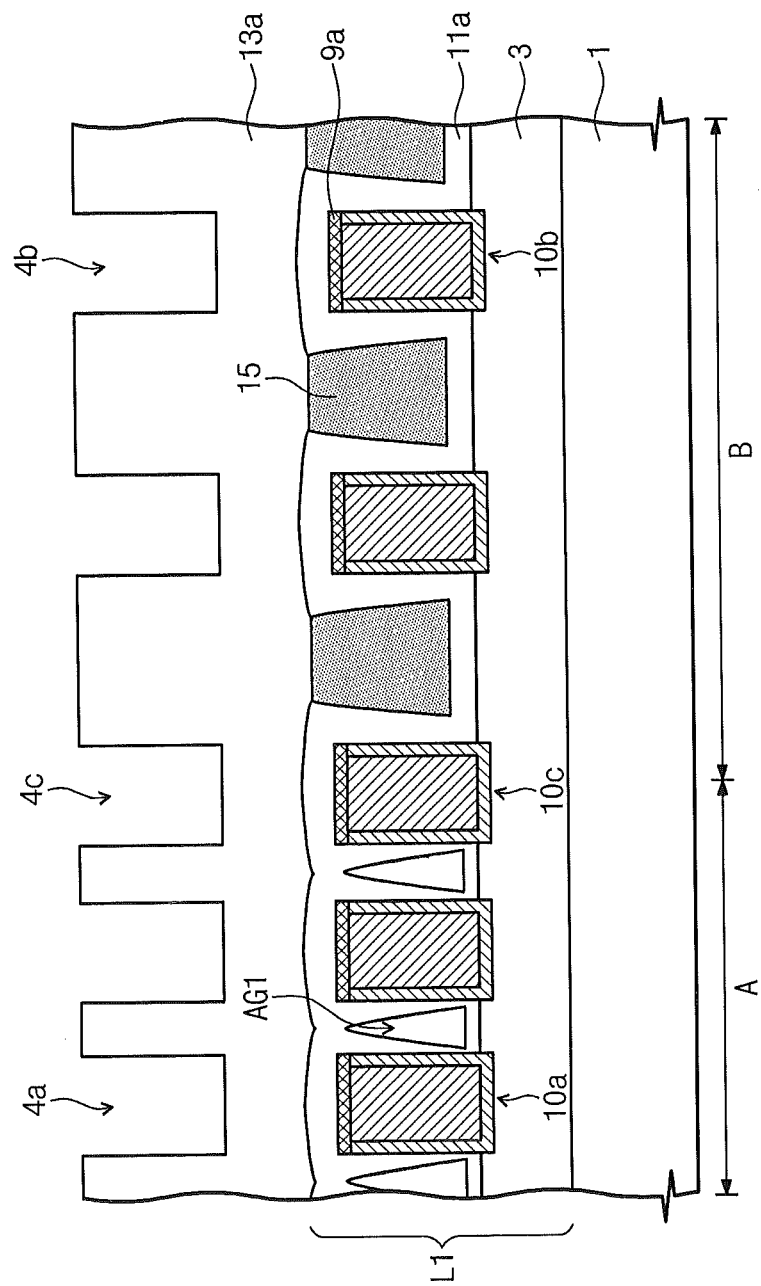
FIGS. 10 and 11 are sectional views illustrating a process of fabricating a semiconductor device, whose section is shaped like that of FIG. 9.
Figure 11:
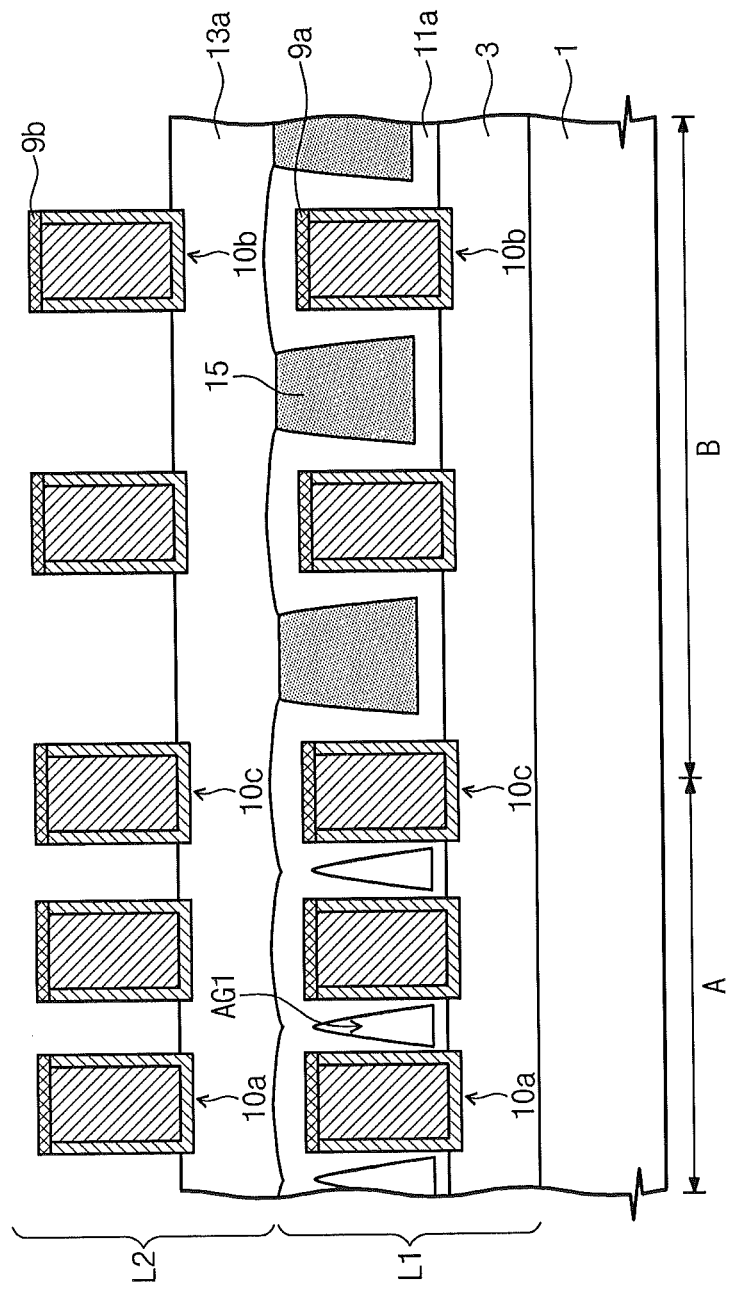

FIGS. 10 and 11 are sectional views illustrating a process of fabricating a semiconductor device, whose section is shaped like that of FIG. 9.

Referring to FIG. 10, a first permeable layer 13a may be formed on the structure of FIG. 7. Here, the first permeable layer 13a may be formed to have a thickness larger than that of FIG. 8. Thereafter, recess regions 4a, 4b, and 4c may be formed in the first permeable layer 13a, in a similar manner to the method described with reference to FIG. 2.

Referring to FIG. 11, conductive patterns 10a, 10b, and 10c constituting a second interconnection structure L2 may be formed in the recess regions 4a, 4b, and 4c, respectively, in a similar manner to the method described with reference to FIG. 3. A second protection layer 9b may be formed on top surfaces of the conductive patterns 10a, 10b, and 10c, in a similar manner to the method described with reference to FIG. 4. Thereafter, the first permeable layer 13a may be etched to thin the first permeable layer 13a and expose sidewalls of the conductive patterns 10a, 10b, and 10c constituting the second interconnection structure L2, in a similar manner to the method described with reference to FIG. 5.

Referring to FIG. 9, an ashing process may be performed to selectively remove the sacrificial layer pattern 15, which is positioned in the first interconnection structure L1. As a result of the ashing process, the second air gap AG2 may be formed in the first interconnection structure L1. Thereafter, a second insulating diffusion barrier layer 11b, air gaps AG1 and AG2, and a second permeable layer 13b may be formed in a similar manner to the method described with reference to FIGS. 6 through 8, thereby forming the second interconnection structure L2.

Figure 12:
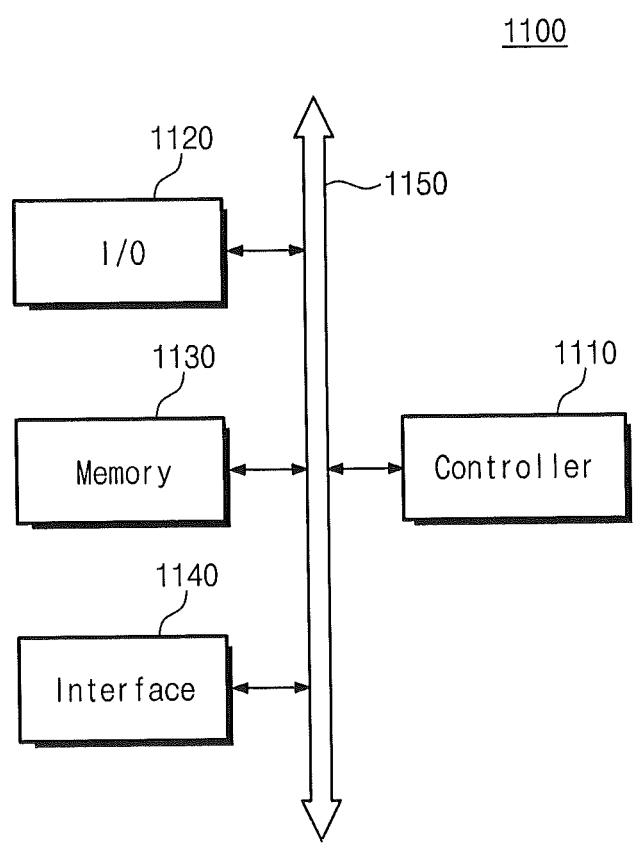
FIG. 12 is a schematic block diagram illustrating an example of memory systems including a semiconductor device according to example embodiments of present inventive concepts.

FIG. 12 is a schematic block diagram illustrating an example of memory systems including a semiconductor device according to example embodiments of present inventive concepts.

Referring to FIG. 12, a memory system 1100 can be applied to a personal digital assistant (PDA), a portable computer, a web tablet, a wireless phone, a mobile phone, a digital music player, a memory card and/or all the devices that can transmit and/or receive data in a wireless communication environment.

The memory system 1100 includes a controller 1110, an input/output device 1120 such as a keypad and a display device, a memory 1130, an interface 1140 and a bus 1150. The memory 1130 and the interface 1140 communicate with each other through the bus 1150.

The controller 1110 includes at least one microprocessor, at least one digital signal processor, at least one micro controller or other process devices similar to the microprocessor, the digital signal processor and the micro controller. The memory 1130 may be used to store an instruction executed by the controller 1110. The input/output device 1120 can receive data or a signal from the outside of the system 1100 or transmit data or a signal to the outside of the system 1100. For example, the input/output device 1120 may include a keyboard, a keypad and/or a display.

The memory 1130 includes at least one of the nonvolatile memory devices according to example embodiments of present inventive concepts. The memory 1130 may further include a different kind of memory, a volatile memory device capable of random access and various kinds of memories.

The interface 1140 transmits data to a communication network or receives data from a communication network.

According to example embodiments of present inventive concepts, a semiconductor device may include an air gap provided on a region, in which conductive patterns are spaced apart from each other with a large space. This makes it possible to reduce RC delay between the conductive patterns and thereby to increase a signal transfer speed of the device.

According to example embodiments of present inventive concepts, a method of fabricating a semiconductor device may include selectively forming a sacrificial pattern between largely-separated second conductive patterns, but not between closely-separated first conductive patterns. Sidewalls of the second conductive patterns may be covered with an insulating diffusion barrier layer having a thickness of 70 Å or thicker, and thus, it may be possible to impede oxygen from infiltrating into the second conductive pattern during an ashing process for removing the sacrificial layer pattern and thereby to protect the second conductive pattern from being damaged.

According to example embodiments of present inventive concepts, by using the fabrication method, it may be possible to form air gaps between interconnection lines with various intervals or pitches. Moreover, although air gaps have been discussed herein by way of example, any gap may be used according to various embodiments of the present disclosure. A gap may be defined, for example, as any void, cavity, or unobstructed space, and may be a gap filled with air (e.g., an air gap), a gap filled with an inert gas or gases (e.g., an inert gas gap), a gap defining a vacuum (e.g., a vacuum gap), etc.

While example embodiments of present inventive concepts have been particularly shown and described, it will be understood by one of ordinary skill in the art that variations in form and detail may be made therein without departing from the spirit and scope of the attached claims.

What is claimed is:

1. A semiconductor device, comprising:
a substrate including first and second regions;
a plurality of first conductive patterns on the first region and a plurality of second conductive patterns on the second region;
an insulating diffusion barrier layer on sidewalls of the plurality of first conductive patterns and the plurality of second conductive patterns;
a permeable layer on the insulating diffusion barrier layer;
a first gap between adjacent ones of the plurality of first conductive patterns; and
a second gap between adjacent ones of the plurality of second conductive patterns,
wherein the first gap is defined by portions of the insulating diffusion barrier layer that are on the sidewalls of the adjacent ones of the plurality of first conductive patterns,
wherein the insulating diffusion barrier layer extends between the first gap and the permeable layer, and the permeable layer is spaced apart from the first gap, and
wherein the second gap is defined by portions of the insulating diffusion barrier layer that are on the sidewalls of the adjacent ones of the plurality of second conductive patterns and the permeable layer.

2. The semiconductor device of claim 1, wherein the insulating diffusion barrier layer comprises a first thickness defining a bottom of the first gap that is thinner than a second thickness of the insulating diffusion barrier layer defining a bottom of the second gap.

3. The semiconductor device of claim 1, wherein the insulating diffusion barrier layer comprises a first thickness on the sidewalls of the first conductive patterns that is thinner than a second thickness of the insulating diffusion barrier layer on the sidewalls of the second conductive patterns.

4. The semiconductor device of claim 1, further comprising a third conductive pattern on a boundary between the first and second regions,
wherein the insulating diffusion barrier layer is on opposing third and fourth sidewalls of the third conductive pattern, and wherein the insulating diffusion barrier layer comprises a first thickness on the third sidewall of the third conductive pattern adjacent the first region that is thinner than a second thickness of the insulating diffusion barrier layer on the fourth sidewall of the third conductive pattern that is adjacent the second region.

5. The semiconductor device of claim 1, further comprising a protection layer between the insulating diffusion barrier layer and upper surfaces of the first and second conductive patterns.

6. The semiconductor device of claim 1, wherein the permeable layer comprises at least one of carbon-doped hydrogenated silicon oxide (SiOCH), low-temperature tetraethoxysilane (TEOS), and a mixture thereof.

7. The semiconductor device of claim 6, wherein the insulating diffusion barrier layer comprises silicon carbon nitride (SiCN), silicon nitride (SiN), or silicon oxycarbide (SiOC).

8. The semiconductor device of claim 1, wherein the adjacent ones of the plurality of first conductive patterns are spaced apart from each other by a first distance, and
wherein the adjacent ones of the plurality of second conductive patterns are spaced apart from each other by a second distance that is greater than the first distance.

9. The semiconductor device of claim 8, wherein an uppermost portion of the first gap is lower than an uppermost portion of the second gap relative to an upper surface of the substrate.

10. The semiconductor device of claim 1, wherein an uppermost portion of the first gap is lower than an uppermost portion of the second gap relative to an upper surface of the substrate.

11. A semiconductor device, comprising:
a plurality of first conductive patterns on a substrate;
a first insulating diffusion barrier layer on sidewalls of the plurity of first conductive patterns;
a first permeable layer on the first insulating diffusion barrier layer;
a plurality of second conductive patterns on the first permeable layer;
a second insulating diffusion barrier layer on sidewalls of the plurality of second conductive patterns;
a second permeable layer on the second insulating diffusion barrier layer;
a first gap between adjacent ones of the plurality of first conductive patterns, the adjacent ones of the plurality of first conductive patterns being spaced apart from each other by a first distance; and
a second gap between adjacent ones of the plurality of second conductive patterns, the adjacent ones of the plurality of second conductive patterns being spaced apart from each other by a second distance that is greater than the first distance,
wherein the first gap is enclosed by the first insulating diffusion barrier layer when viewed in cross section, and
wherein the second gap is defined by portions of the second insulating diffusion barrier layer that are on the sidewalls of the adjacent ones of the plurality of second conductive patterns and the second permeable layer.

12. The semiconductor device of claim 11, wherein the first insulating diffusion barrier layer comprises a first thickness defining a bottom of the first gap that is thinner than a second thickness of the second insulating diffusion barrier layer defining a bottom of the second gap.

13. The semiconductor device of claim 11, further comprising a protection layer between the first insulating diffusion barrier layer and upper surfaces of the first conductive patterns.

14. The semiconductor device of claim 11, further comprising a protection layer between the second insulating diffusion barrier and upper surfaces of the second conductive patterns.

15. The semiconductor device of claim 11, wherein the first permeable layer comprises at least one of carbon-doped hydrogenated silicon oxide (SiOCH), low-temperature tetraethoxysilane (TEOS), and a mixture thereof.

16. A semiconductor device comprising:
- a plurality of conductive patterns on a substrate, the plurality of conductive patterns comprising first ones of the plurality of conductive patterns that are adjacent each other and spaced apart from each other by a first distance and second ones of the plurality of conductive patterns that are adjacent each other and spaced apart from each other by a second distance that is greater than the first distance;
- an insulating diffusion barrier layer on upper surfaces and sidewalls of the plurality of conductive patterns;
- a permeable layer on the insulating diffusion barrier layer;
- a first gap between the first ones of the plurality of conductive patterns and defined by the insulating diffusion barrier layer, the insulating diffusion barrier layer extending on a space between the first ones of the plurality of conductive patterns and defining an uppermost portion of the first gap; and
- a second gap between the second ones of the plurality of conductive patterns and defined by the insulating diffusion barrier layer and the permeable layer.

17. The semiconductor device of claim 16, wherein the uppermost portion of the first gap is lower than an uppermost portion of the second gap relative to an upper surface of the substrate.

18. The semiconductor device of claim 16, wherein a portion of the insulating diffusion barrier layer on the sidewalls of the first ones of the plurality of conductive patterns has a first thickness, and
wherein a portion of the insulating diffusion barrier layer on the sidewalls of the second ones of the plurality of conductive patterns has a second thickness that is greater than the first thickness.

19. The semiconductor device of claim 16, wherein the permeable layer comprises at least one of carbon-doped hydrogenated silicon oxide (SiOCH), low-temperature tetraethoxysilane (TEOS), and a mixture thereof.

20. The semiconductor device of claim 19, wherein the insulating diffusion barrier layer comprises silicon carbon nitride (SiCM), silicon nitride (SiN), or silicon oxycarbide (SiOC).

* * * * *